United States Patent
Knobloch et al.

(10) Patent No.: US 9,042,072 B2
(45) Date of Patent: May 26, 2015

(54) METHOD AND SYSTEM FOR LIGHTNING PROTECTION WITH DISTRIBUTED TRANSIENT VOLTAGE SUPPRESSION

(75) Inventors: Aaron Jay Knobloch, Niskayuna, NY (US); Emad Andarawis Andarawis, Ballston Lake, NY (US); Harry Kirk Mathews, Jr., Niskayuna, NY (US); Avinash Srikrishnan Kashyap, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 471 days.

(21) Appl. No.: 13/436,060

(22) Filed: Mar. 30, 2012

(65) Prior Publication Data
US 2013/0258541 A1    Oct. 3, 2013

(51) Int. Cl.
| | |
|---|---|
| *H02H 3/22* | (2006.01) |
| *H01B 7/28* | (2006.01) |
| *H02H 1/00* | (2006.01) |
| *H02H 1/04* | (2006.01) |
| *H02H 9/06* | (2006.01) |

(52) U.S. Cl.
CPC ......... *H01B 7/2813* (2013.01); *Y10T 29/49117* (2015.01)

(58) Field of Classification Search
CPC ............. H02H 9/04; H02M 7/06; H02M 7/05
USPC ........................................................ 361/111
See application file for complete search history.

(56) References Cited

U.S. PATENT DOCUMENTS

| | | | |
|---|---|---|---|
| 3,551,783 A | 12/1970 | Reich | |
| 4,325,097 A | 4/1982 | Clark | |
| 5,103,289 A | 4/1992 | Brady | |
| 6,489,660 B1 | 12/2002 | Einthoven et al. | |
| 6,867,436 B1 | 3/2005 | Matteson et al. | |
| 7,339,776 B1 | 3/2008 | Hertel et al. | |
| 7,361,942 B1 | 4/2008 | Matteson et al. | |
| 7,426,581 B2 * | 9/2008 | Chan et al. | 709/250 |
| 7,510,903 B1 | 3/2009 | Matteson et al. | |
| 8,638,535 B2 * | 1/2014 | Roy et al. | 361/111 |
| 2002/0195689 A1 | 12/2002 | Lee et al. | |
| 2005/0006731 A1 | 1/2005 | O'Shea et al. | |
| 2008/0079126 A1 | 4/2008 | Autry et al. | |
| 2009/0015978 A1 | 1/2009 | Clark | |
| 2009/0290276 A1 | 11/2009 | Carcouet et al. | |
| 2010/0109147 A1 | 5/2010 | Autry | |
| 2010/0127365 A1 | 5/2010 | Galera et al. | |
| 2010/0237356 A1 | 9/2010 | Haney et al. | |

FOREIGN PATENT DOCUMENTS

| | | |
|---|---|---|
| EP | 0537843 A1 | 4/1993 |
| GB | 1447763 | 9/1976 |

* cited by examiner

*Primary Examiner* — Dharti Patel
(74) *Attorney, Agent, or Firm* — Scott J. Asmus

(57) ABSTRACT

A method of method of forming a wide band-gap semiconductor transient voltage suppressor (TVS) assembly and a system for a transient voltage suppressor (TVS) assembly are provided. The TVS assembly includes a connecting component configured to electrically couple a first electrical component to a second electrical component located remotely from the first electrical component through one or more electrical conduits and a transient voltage suppressor device positioned within the connecting component and electrically coupled to the one or more electrical conduits wherein the TVS device includes a wide band-gap semiconductor material.

21 Claims, 6 Drawing Sheets

METHOD AND SYSTEM FOR LIGHTNING PROTECTION WITH DISTRIBUTED TRANSIENT VOLTAGE SUPPRESSION

BACKGROUND

The disclosure relates generally to high temperature semiconductor devices, and more specifically, to semiconductor devices for transient voltage suppression integrated with wiring components.

Lightning strikes or other sources of transient voltage that may be induced onto electrical wires or components tend to damage equipment, often times rendering the equipment inoperable. Electronic means of blocking electrical voltage spikes caused by the lightning or transient voltage are often used to mitigate the effects of the voltage spikes. Other means shunt the spike energy to ground, permitting the spike energy to bypass the potentially affected equipment. Lightning strikes protection is important in systems such as airframe, aircraft engines, unmanned vehicles, wind turbines, power generation and power distribution and transmission. However, such electronic components used to block or shunt the voltage spikes are relatively large, which takes up valuable space on circuit boards and in enclosures on, for example, an aircraft or in an aircraft engine controller, such as, but not limited to, a full authority digital engine (or electronics) control (FADEC). The relatively large components also represent an undesirable amount of weight that must be carried by the aircraft. Moreover, the semiconductor material, typically, a form of silicon, used to fabricate the transient voltage suppression devices are limited to relatively cool ambient environments, where their leakage currents are low, for example, locations with an ambient temperature less then approximately 125° C. At least some known TVS systems attempt to provide protection from electrical voltage spikes caused by the lightning or transient voltage using components mounted at a centralized computing or control system for equipment being protected. One example of a central computing or control system is a full authority digital engine (or electronics) control (FADEC) used with some aircraft engines. The FADEC typically are located on the fan of the engine. However, there is a growing drive to distribute electronics or control systems closer to the actuators and sensors that they control. These locations where voltage suppression capabilities are needed, are also relatively hot locations near the equipment being protected, for example, locations with ambient temperatures in a range that exceeds 125° C. ambient up to approximately 300° C. or more. Moreover, voltage spikes on the system remotely from the centralized computing or control system must travel relatively long distances before being sensed and mitigated at the TVS components at the centralized computing or control system.

BRIEF DESCRIPTION

In one embodiment, a transient voltage suppressor (TVS) assembly includes a connecting component configured to electrically couple a first electrical component to a second electrical component located remotely from the first electrical component through one or more electrical conduits and a transient voltage suppressor device positioned within the connecting component and electrically coupled to the one or more electrical conduits wherein the TVS device includes a wide band-gap semiconductor material.

In another embodiment, a method of forming a wide band-gap semiconductor transient voltage suppressor (TVS) assembly wherein the method includes assembling a connecting component that is configured to electrically couple a first electrical component to a second electrical component located remotely from the first electrical component through one or more electrical conduits, positioning a TVS device within the connecting component wherein the TVS device is formed of a wide band-gap semiconductor material, and electrically coupling the TVS device to the one or more electrical conduits.

In yet another embodiment, an aircraft electrical system includes a first electrical component positioned on an aircraft in a location where an ambient temperature is capable of exceeding approximately 125° Celsius, a second electrical component positioned on the aircraft remotely from the first electrical component, and a connecting member extending between the first electrical component and the second electrical component wherein the connecting member includes a transient voltage suppressor (TVS) assembly positioned within the connecting member and electrically coupled to at least one of the first electrical component and the second electrical component through the connecting member, the TVS assembly including a TVS device formed of a wide band-gap semiconductor material.

BRIEF DESCRIPTION OF THE DRAWINGS

These and other features, aspects, and advantages of the present technique will become better understood when the following detailed description is read with reference to the accompanying drawings in which like characters represent like parts throughout the drawings, wherein.

DETAILED DESCRIPTION

Figure 1:
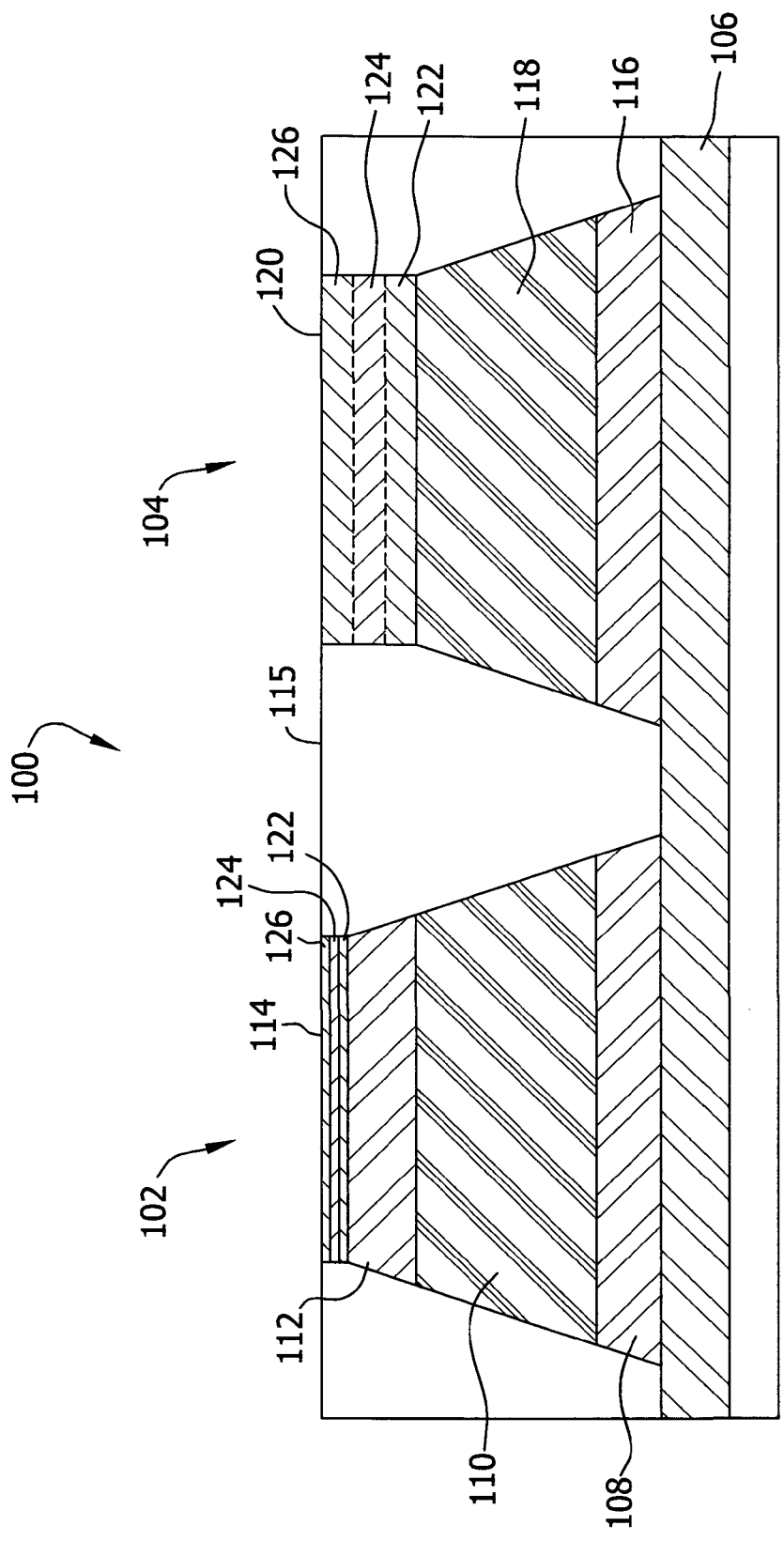
FIG. 1 is a side elevation view of a transient voltage suppression (TVS) assembly in accordance with an exemplary embodiment of the present system.

The following detailed description illustrates embodiments of the system by way of example and not by way of limitation. It is contemplated that the systems and methods have general application to electronic component manufacturing and packaging in power electronics, signal electronics, and electromagnetic interference (EMI) protection in industrial, commercial, and residential applications.

As used herein, an element or step recited in the singular and preceded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Embodiments of the present disclosure demonstrate an architecture for a transient voltage protection system based on a plurality semiconductor based TVS devices that operate with low leakage current, can withstand multiple lightning strikes while operating at or beyond 300° C., and are distributed throughout the electrical and communication systems being protected. Distributing the TVS devices to locations closest to possible transient voltage source points facilitates reducing the severity of the induced electrical spikes and the time the electrical spikes exist on the lines. Dissipating the energy of a spike away from the electrical components coupled to the electrical system facilitates reducing the impact of a lightning strike or other source of transient voltage on the lines. Moreover, providing multiple paths to ground further enhances the capability of the transient voltage protection system to drain charge/current from the system.

In one embodiment, the device is fabricated from silicon carbide (SiC). In other embodiments, the devices are fabricated from other wide band gap materials such as, but not limited to, gallium nitride (GaN), diamond, aluminum nitride (AlN), boron nitride (BN), and combinations thereof. The wide band gap semiconductor TVS device is reliably operable up to approximately 500° C., however, other components, such as, the TVS packaging may be more limiting in the example embodiments. The TVS is a clamping device, suppressing approximately all over-voltages above its breakdown voltage. The TVS device typically comprises three SiC layers (N-P-N). In other embodiments, the three layers comprise P-N-P layers. In an N-P-N type device, when the device is subjected to a potential across the two N layers, a depletion layer is formed (mostly) in the P layer because its doping is much lower compared to the two N layers. For example, one to five orders of magnitude lower, or one-tenth to one ten-thousandth of the dopant concentration of the N layers. For a further example, if the doping concentration in the N layers is approximately $10^{18}/cm^3$, the doping concentration in the P layers would be approximately $10^{15}/cm^3$. As the voltage across the device is increased, the depletion region extends all across the P layer and touches the N layer on the other side. This leads to a condition known as "punch-through" and a large amount of current begins flowing in the device. The device is able to maintain this condition with minimal change in the voltage across it. A similar explanation describes the operation when the polarity of the layers is changed to P-N-P. In other embodiments, the TVS device operates using avalanche breakdown physics.

The TVS devices disclosed herein improve the size, temperature range, capacitance, and electrical leakage current parameters over current TVS devices. Because of such improvements, the TVS devices may be located at other places in the electrical system than where the electronics that they protecting are located. The TVS devices may be located in the electrical cable, wire harness or connector connecting the electronic boards together, which can save space in the electronics boards and also allow for more distributed protection along the harness and cabling. Additionally, the higher temperature capability of the SiC TVS enables electronic systems with integrated lightning protection to be located in environments that exceed 125° C. ambient up to approximately 300° C. or more. The ability to place the TVS devices in the portion of the harnesses or connectors closer to sensors and actuators may offer added protection benefits and increased reliability.

Additionally, integrating lightning protection in wiring harnesses enables more optimized harness designs because currently without any built in protection, the harness is expected to see the bulk of the energy in a lightning strike, and therefore the harnesses must be designed, and shielded appropriately. Integrating TVS devices in the harness especially in a distributed manner may reduce the overall shielding and isolation required in the harness permitting lower system weight. The transient voltage control and suppression capability of a distributed TVS system is improved over a TVS system at a centralized computing or control system due at least in part to the multiple paths to ground provided by the distributed system.

Additionally, the distributed TVS system described herein provides improved thermal management by allowing for the dissipation of the energy of electrical voltage spikes outside the computing or control system. The removal of TVS devices from the FADEC facilitates shrinking the size of the central computing or control system through a lesser need for thermal management around these devices. A distributed TVS architecture enables distributed computing or control particularly in harsh environments, facilitates energy dissipation away from sensitive electronics, and provides inherent redundancy by dissipating the energy through multiple paths.

FIG. 1 is a side elevation view of a transient voltage suppression (TVS) assembly 100 in accordance with an exemplary embodiment of the present system. In the exemplary embodiment, TVS assembly 100 includes a TVS device 102 and a PN junction 104 electrically coupled in series through a semiconductor substrate 106 comprising a first polarity, for example, an N+ polarity based on the doping implemented in the fabrication of substrate 106.

TVS device 102 includes a mesa structure that is formed on substrate 106 of for example, silicon carbide having an N+ type conductivity. In the exemplary embodiment, an N+ type conductivity layer 108 is epitaxially grown on substrate 106. An epitaxially grown P- layer 110 is coupled in electrical contact with layer 108. An epitaxially grown N+ layer 112 is coupled in electrical contact with P- layer 110. In the exemplary embodiment, P- layer 110 is relatively lightly doped relative to the N+ layers 108 and 112. A uniform doping concentration of substrate 106 and layers 108, 110, and 112 improves a uniformity of the electric field distribution in the depletion region of layer 110, thereby improving the breakdown voltage characteristic. Moreover, the mesa structure has a beveled sidewall angled approximately five degrees to approximately eighty degrees with respect to an interface between adjacent contacting layers to reduce the maximum electric field profile at a surface of the die. A first electrical contact 114 is coupled in electrical contact with layer 112 and extends to a contact surface 115 of TVS assembly 100.

PN junction 104 is formed similarly as TVS device 102. An N+ type conductivity layer 116 is epitaxially grown on substrate 106. An epitaxially grown P- layer 118 is coupled in electrical contact with layer 116. A second electrical contact 120 is coupled in electrical contact with layer 118 and extends to contact surface 115. Electrical contacts 114 and 120 may be formed by sputtering, vapor deposition, evaporation, or other method for adhering a metal contact surface to semiconductor surfaces of layers 112 and 118. In various embodiments, electrical contacts 114 and 120 include sublayers of different materials. For example, contacts 114 and 120 may include a first sublayer 122 comprising, for example, nickel (Ni), which possesses good adherence characteristics with respect to the semiconductor material of layer 112 and 118. A second sublayer 124 comprising for example, tungsten (W) is deposited onto Ni sublayer 122 and a third sublayer comprising, for example, gold (Au) is deposited onto W sublayer 124. W and Au are used to provide lower resistivity for electrical contacts 114 and 120. Although, described herein as comprising sublayers of Ni, W, and Au, it should be recognized that electrical contacts 114 and 120 may comprise more or less that three sublayers comprising the same or different materials than Ni, W, and Au.

In the exemplary embodiment, TVS assembly 100 is formed in a "flip chip" configuration. Accordingly, electrical contacts 114 and 120 are oriented on the same side of TVS assembly 100. Moreover, TVS device 102 operates using "punch-through," or also known as, "reach-through" physics such that as the voltage across TVS device 102 is increased, a depletion region extends all across P– layer 110 and touches N+ layers 108 and 112. This leads to a condition known as "punch-through" and large amounts of current are able to flow through TVS device 102. TVS device 102 is able to maintain this condition with minimal change in the voltage across it.

In various embodiments, TVS device 102 is sized and formed to ensure a maximum electric field internal to the semiconductor material of TVS device 102 is maintained less than two megavolts per centimeter. Additionally, TVS device 102 is configured to maintain an increase in blocking voltage of less than 5% for current in a range of less than approximately 1.0 nanoamp to approximately 1.0 milliamp. As used herein, blocking voltage refers to the highest voltage at which TVS device 102 does not conduct or is still in an "off" state. Moreover, TVS device 102 is configured to maintain an electrical leakage current of less than approximately 1.0 microamp up to approximately the punch-through voltage of TVS device 102 at room temperature and less than 1.0 microamp up to approximately the punch-through voltage at operating temperatures that exceeds 125° C. ambient up to approximately 300° C. or more.

In various embodiments, TVS device 102 is configured to exhibit punch through characteristics between approximately 5.0 volts to approximately 75.0 volts. In various other embodiments, TVS device 102 is configured to exhibit punch through characteristics between approximately 75.0 volts to approximately 200.0 volts. In still other embodiments, TVS device 102 is configured to exhibit punch through characteristics greater than approximately 200 volts.

Although the semiconductor material used to form TVS device 102 and PN junction 104 is described herein as being silicon carbide, it should be understood that the semiconductor material may include other wide band-gap semiconductors capable of performing the functions described herein and in the environments described herein. Such wide-band gap semiconductors include a lower circuit capacitance that enables more TVS assemblies on an electrical signal line without signal degradation.

Figure 2:
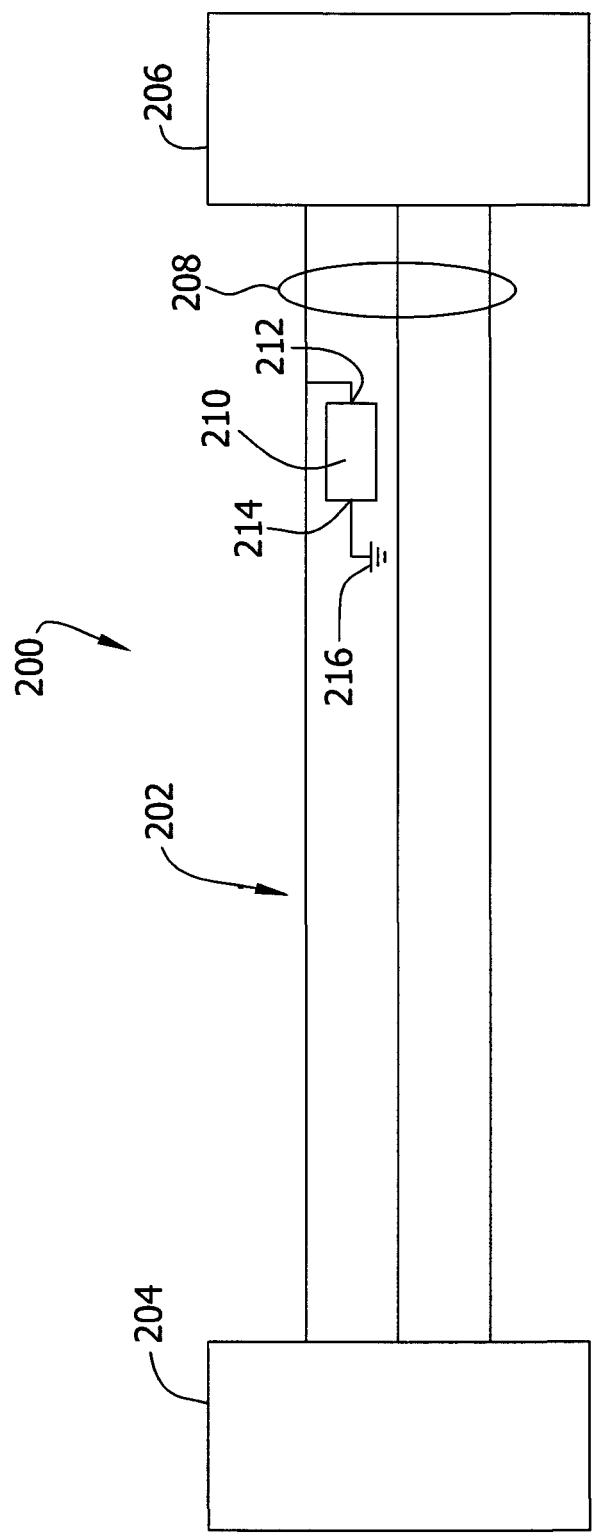
FIG. 2 is a perspective view of a transient voltage suppressor (TVS) assembly in accordance with an exemplary embodiment of the present invention.

FIG. 2 is a perspective view of a transient voltage suppressor (TVS) assembly 200 in accordance with an exemplary embodiment of the present invention. In the exemplary embodiment, a connecting component 202 is configured to electrically couple a first electrical component 204 to a second electrical component 206 located remotely from first electrical component 204 through one or more electrical conduits 208. A transient voltage suppressor (TVS) device 210 positioned within the connecting component and electrically coupled to one or more electrical conduits 208. In one embodiment, a first terminal 212 of TVS device 210 is electrically coupled to one or more electrical conduits 208 and a second terminal 214 is electrically coupled to a ground connection 216. In various embodiments, second terminal 214 is electrically coupled to a return conduit (not shown in FIG. 2). Also in the exemplary embodiment TVS device 210 is formed using layers of doped wide band-gap semiconductor material. TVS device 210 may include a single TVS device or may include a plurality of independent TVS devices. The plurality of TVS devices may be connected to the one or more electrical conduits 208 separately, connected in electrical parallel, electrical series, or combinations thereof.

TVS device 210 is capable of operating reliably at temperatures in the range of from 0° C. and lower to approximately 300° C. In one embodiment, TVS device 210 is fabricated from silicon carbide (SiC). In other embodiments, TVS device 210 are fabricated from other wide band gap materials such as, but not limited to, gallium nitride (GaN), diamond, aluminum nitride (AlN), boron nitride (BN), and combinations thereof. Wide band gap semiconductor TVS device 210 itself is reliably operable up to approximately 500° C., however, other components, such as, the TVS packaging may be more limiting in the example embodiments.

Figure 3:
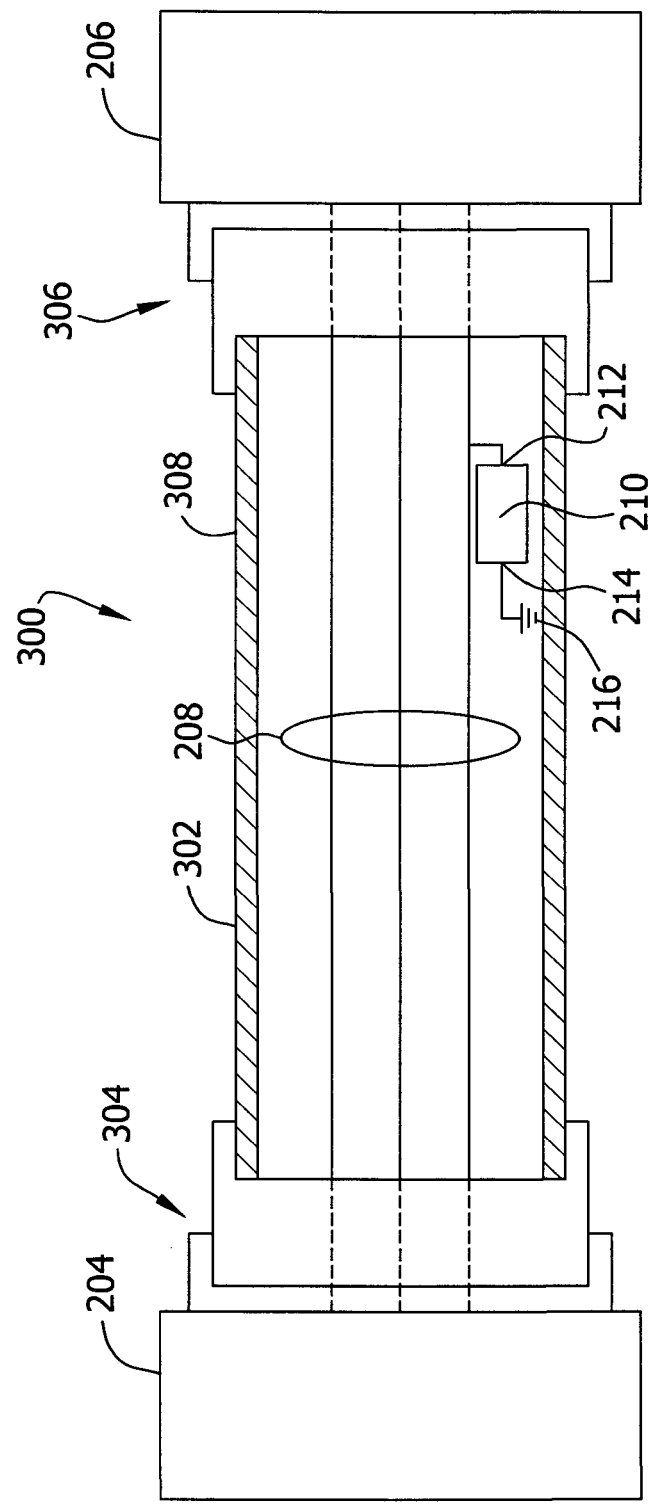
FIG. 3 is a perspective view of a transient voltage suppressor (TVS) assembly in accordance with another exemplary embodiment of the present invention.

FIG. 3 is a perspective view of a transient voltage suppressor (TVS) assembly 300 in accordance with another exemplary embodiment of the present invention. In the exemplary embodiment, a connecting component 302, such as, a cable is configured to electrically couple to first electrical component 204 using a first connector 304 and to second electrical component 206 using a second connector 306. Connectors 304 and 306 also maintain mechanical coupling between cable 302 and respective electrical components 204 and 206. Typically, second electrical component 206 is located remotely from first electrical component 204. A transient voltage suppressor (TVS) device 210 is positioned within cable 302 and is electrically coupled to one or more electrical conduits 208. In the exemplary embodiment, electrical conduits 208 are enclosed in a sheath that extends at least partially from first connector 304 to second connector 306. In one embodiment, a first terminal 212 of TVS device 210 is electrically coupled to one or more electrical conduits 208 and a second terminal 214 is electrically coupled to a ground connection 216. In various embodiments, second terminal 214 is electrically coupled to a return conduit (not shown in FIG. 3). Also in the exemplary embodiment TVS device 210 is formed using layers of doped wide band-gap semiconductor material. TVS device 210 may include a single TVS device or may include a plurality of independent TVS devices. The plurality of TVS devices may be connected to the one or more electrical conduits 208 separately, connected in electrical parallel, electrical series, or combinations thereof.

TVS device 210 is capable of operating reliably at temperatures in the range of from 0° C. and lower to approximately 300° C. In one embodiment, TVS device 210 is fabricated from silicon carbide (SiC). In other embodiments, TVS device 210 are fabricated from other wide band gap materials such as, but not limited to, gallium nitride (GaN), diamond, aluminum nitride (AlN), boron nitride (BN), and combinations thereof. Wide band gap semiconductor TVS device 210 itself is reliably operable up to approximately 500° C., however, other components, such as, the TVS packaging may be more limiting in the example embodiments.

Figure 4:
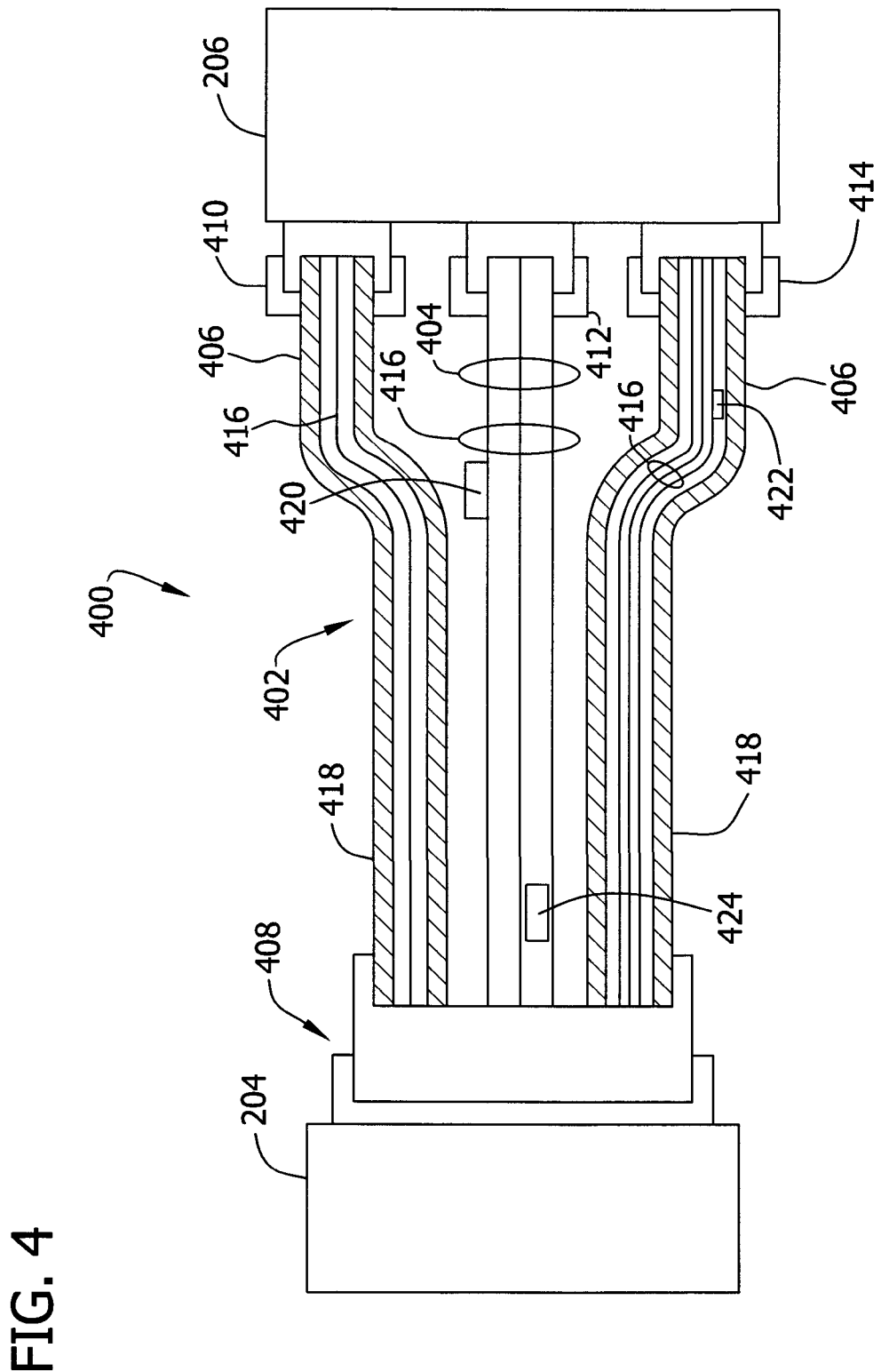
FIG. 4 is a perspective view of a transient voltage suppressor (TVS) assembly in accordance with another exemplary embodiment of the present invention.

FIG. 4 is a perspective view of a transient voltage suppressor (TVS) assembly 400 in accordance with another exemplary embodiment of the present invention. In the exemplary embodiment, a connecting component 402, such as, a wiring harness comprising at least one of one or more wires 404 and one or more of cables 406 is configured to electrically couple to first electrical component 204 using a first connector 408 and to second electrical component 206 using one or more second connectors 410, 412, and 414. Connectors 408, 410, 412, and 414 also maintain mechanical coupling between wiring harness 402 and respective electrical components 204 and 206. The separate wires 404 and/or cables 406 may be bound together to form wiring harness 402 using, for example, but not limited to, clamps, cable ties, cable lacing, sleeves, electrical tape, conduit, a weave of extruded string, or a combination thereof.

Typically, second electrical component 206 is located remotely from first electrical component 204. A transient voltage suppressor (TVS) device 210 is positioned within wiring harness 402 and is electrically coupled to one or more electrical conduits 416. In the exemplary embodiment, electrical conduits 416 are enclosed in a sheath 418 that extends at least partially from first connector 408 to one or more second connectors 410 and 414. Electrical conduits 416 may also comprise individual wires 404. One or more TVS devices 420, 422, and 424 may be electrically coupled to electrical conduits 416 whether electrical conduits 416 are individual wires 404 or whether they are enclosed in sheath 418. In one embodiment, a first terminal of TVS devices 420, 422, and 424 are electrically coupled to one or more electrical conduits 416 and a second terminal is electrically coupled to a ground connection, similar to the embodiments shown above. In various embodiments, a second terminal may be electrically coupled to a return conduit as described above. In the exemplary embodiment one or more TVS devices 420, 422, and 424 are formed using layers of doped wide band-gap semiconductor material. TVS devices 420, 422, and 424 may include a single TVS device or may include a plurality of independent TVS devices. The plurality of TVS devices may be connected to the one or more electrical conduits 416 separately, connected in electrical parallel, electrical series, or combinations thereof.

TVS devices 420, 422, and 424 are capable of operating reliably at temperatures in the range of from 0° C. and lower to approximately 300° C. In one embodiment, TVS devices 420, 422, and 424 are fabricated from silicon carbide (SiC). In other embodiments, TVS devices 420, 422, and 424 are fabricated from other wide band gap materials such as, but not limited to, gallium nitride (GaN), diamond, aluminum nitride (AlN), boron nitride (BN), and combinations thereof. Wide band gap semiconductor TVS devices 420, 422, and 424 are reliably operable up to approximately 500° C., however, other components, such as, the TVS packaging may be more limiting in the example embodiments.

Figure 5:
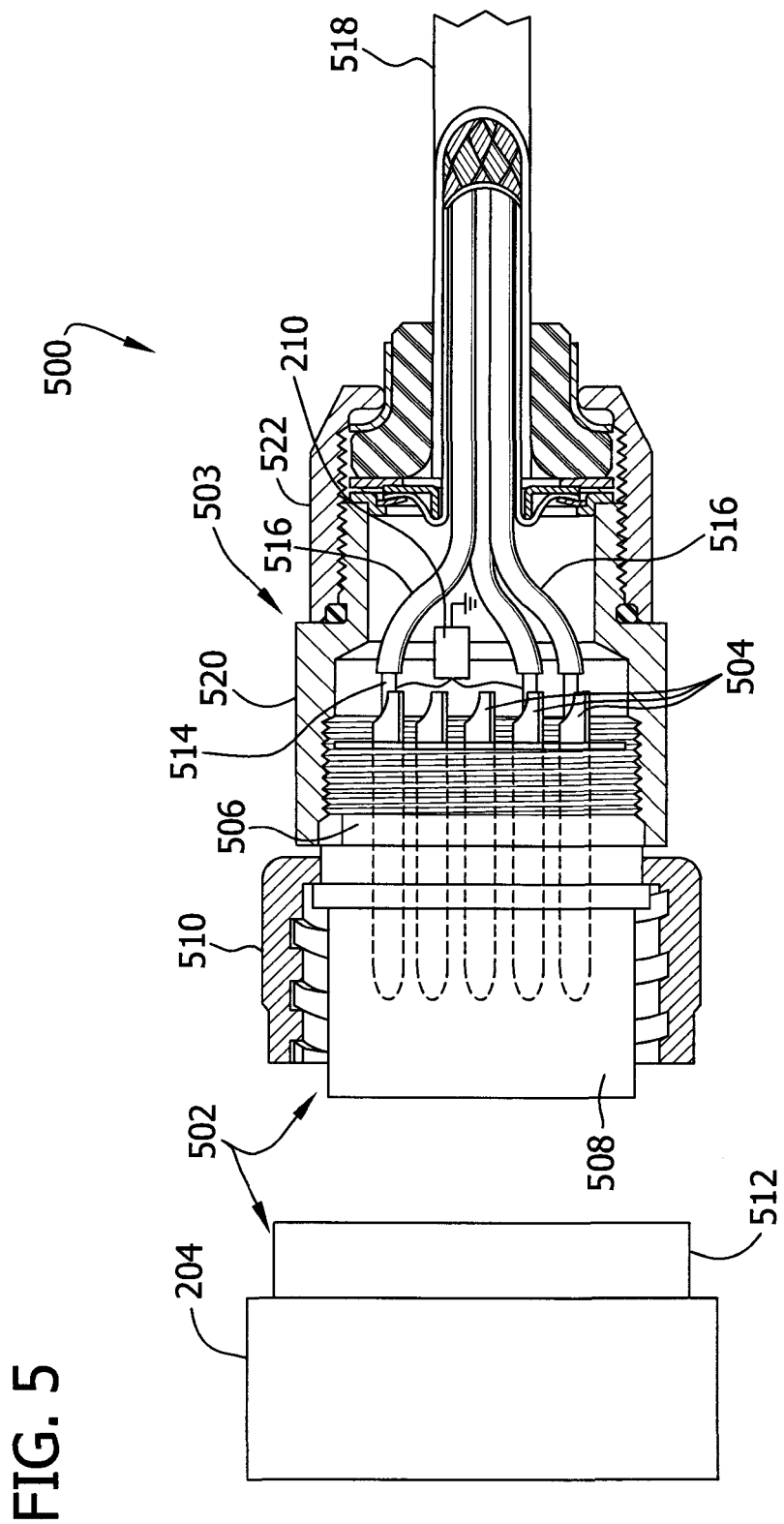
FIG. 5 is a perspective view of a transient voltage suppressor (TVS) assembly in accordance with another exemplary embodiment of the present invention.

FIG. 5 is a perspective view of a transient voltage suppressor (TVS) assembly 500 in accordance with another exemplary embodiment of the present invention. In the exemplary embodiment, a connecting component 502, such as, an electrical connector, is configured to electrically couple to first electrical component 204. A first connector half of connector 502 includes one or more connector pins 504 inserted through apertures in a connector insert 506 pressed into an interior of a connector free shell 508. A coupling nut 510 surrounds a portion of free shell 508 and is threaded to engage complementary threads on a second connector half 512 affixed to first electrical component 204. Uninsulated portions 514 of individual wires 516 are electrically coupled to connector pins 504 using for example, but not limited to, soldering and crimping. A cable 518 carrying wires 516 is supported by a backshell 520 and cable clamp assembly 522.

A transient voltage suppressor (TVS) device 210 is positioned within connector 502 and is electrically coupled to one or more of wires 516. In one embodiment, a first terminal of TVS device 210 is electrically coupled to one or more of wires 516 and a second terminal is electrically coupled to a ground connection, similar to the embodiments shown above. In various embodiments, the second terminal may be electrically coupled to a return conduit as described above. In the exemplary embodiment TVS device 210 is formed using layers of doped wide band-gap semiconductor material. TVS device 210 may include a single TVS device or may include a plurality of independent TVS devices. The plurality of TVS devices may be connected to the one or more of wires 516 separately, connected in electrical parallel, electrical series, or combinations thereof.

TVS device 210 is capable of operating reliably at temperatures in the range of from 0° C. and lower to approximately 300° C. In one embodiment, TVS device 210 is fabricated from silicon carbide (SiC). In other embodiments, TVS device 210 is fabricated from other wide band gap materials such as, but not limited to, gallium nitride (GaN), diamond, aluminum nitride (AlN), boron nitride (BN), and combinations thereof. Wide band gap semiconductor TVS device 210 is reliably operable up to approximately 500° C., however, other components, such as, the TVS packaging may be more limiting in the example embodiments.

Figure 6:
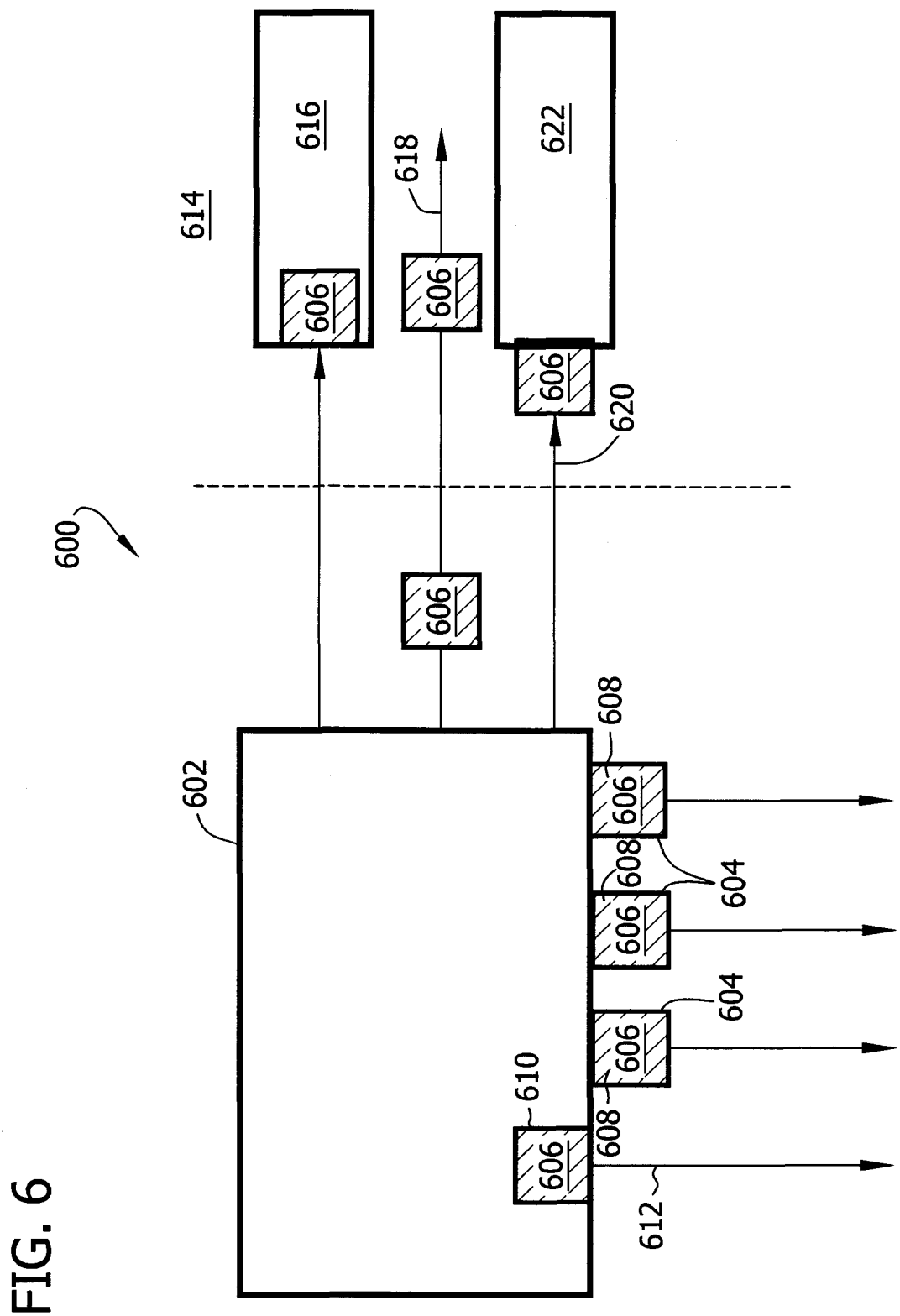
FIG. 6 is a schematic block diagram of a transient voltage suppression (TVS) system in accordance with an exemplary embodiment of the present invention.

FIG. 6 is a schematic block diagram of a transient voltage suppression (TVS) system 600 in accordance with an exemplary embodiment of the present invention. In the exemplary embodiment, a central computing or control system 602, for example, but not limited to, a full authority digital engine (or electronics) control (FADEC) includes a plurality of connections to components external to central computing or control system 600. In one embodiment, a first connection 604 is embodied in a cable connector comprises a TVS assembly 606 within a backshell 608 of first connection 604. In the exemplary embodiment, TVS assembly 606 includes a single TVS device. In various other embodiments, TVS assembly 606 includes a plurality of TVS devices electrically coupled in at least one of series, parallel, and combinations thereof.

TVS system 600 may also include a connector socket 610 that may mount to an enclosure housing central computing or control system 602 or to an electronic component board of central computing or control system 602. Connector socket 610 is configured to receive a complementary end of a cable 612. In the exemplary embodiment, connector socket 610 includes a TVS assembly 606. In various embodiments, cable 612 may also comprise TVS assembly 606, for example within a backshell of a cable-side connector.

TVS system 600 may be used in systems that include relatively high temperature areas 614, for example, where environmental temperatures can exceed, for example, 125° C. ambient up to approximately 300° C. or more. In areas 614, TVS assemblies 606 may be included with components that are operating in such high temperature environments. In the exemplary embodiment, a TVS assembly may be included within a high temperature component 616, may be spaced along a length of a cable or cable harness 618, and/or may be included at a connection end 620 of a component 622. As described herein multiple TVS assemblies 606 can be sized and positioned for multiple redundancy, configured for a "network" response to accommodate failures of some TVS assemblies while maintaining protection via other TVS assemblies in the network.

During operation, having multiple paths to ground through the plurality of TVS assemblies 606 located throughout TVS system 600 for the dissipation of energy facilitates protecting central computing or control system 602 and other equipment from lightning strikes and other transient voltage events.

In various embodiments, at least some of the TVS devices are located in areas with favorable thermal dissipation such as low temperature gas flow, areas with high velocity gas flow, or in contact with structures having a high thermal mass. Moreover, the TVS devices are located electrically as part of the system such that they serve to increase the redundancy of the electrical protection provided to a plurality of the electrical components by creating multiple paths that may or may not be co-located for the energy to flow.

The above-described embodiments of a method and system of transient voltage suppression provides a cost-effective and reliable means for reducing and/or eliminating voltage spikes induced into electrical systems such as from EMI and/or lightning strikes. More specifically, the methods and systems described herein facilitate positioning the TVS device close to areas prone to lightning strikes or an origination of electromagnetic surges or spikes and at multiple points along a signal or power line. The small size of the wide band gap semiconductor TVS device and flip chip packaging permit such positioning within cables, wiring harnesses, and/or connectors. Moreover, the wide band gap semiconductor material permits placement of the TVS device in high temperature environments where transmit voltage protection is needed. In addition, the above-described methods and systems facilitate operating electronic components in high density housings without additional cooling support. As a result, the methods and systems described herein facilitate operating vehicles, such as aircraft in a cost-effective and reliable manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical system comprising:
    a plurality of distributed electrical components, at least some of the plurality of distributed electrical components positioned remotely from other ones of the plurality of distributed electrical components, at least some of the plurality of distributed electrical components electrically coupled through respective connecting components comprising a plurality of electrical conduits to other ones of the plurality of distributed electrical components; and
    a networked distributed protection system comprising a plurality of transient voltage suppression (TVS) devices electrically coupled to at least one of said electrical conduits and said distributed electrical components, said TVS devices positioned within said connecting components and proximate said at least one of said electrical conduits and said distributed electrical components providing a plurality of electrical dissipation paths for each distributed electrical component through the electrical conduits and TVS devices, wherein said TVS devices are distributed to locations proximate possible transient voltage source points.

2. A system in accordance with claim 1, wherein said electrical system comprises at least one of an airframe electrical system, an aircraft engine electrical system, an unmanned vehicle electrical system, a wind turbine electrical system, a power generation electrical system, and a power distribution and transmission electrical system.

3. A system in accordance with claim 1, wherein said distributed electrical components comprise at least one of a connector, an engine control system, a full authority digital engine control (FADEC), a remote interrogation unit (RIU), a smart sensor, an actuator, and an end electrical node.

4. A system in accordance with claim 1, wherein at least one of said plurality of TVS devices is positioned at least one of within and proximate to at least one of a flow of low temperature gas, a flow of high velocity gas, and in contact with an object having a relatively high thermal mass.

5. A system in accordance with claim 1, wherein at least some of said plurality of TVS devices are electrically coupled within said aircraft electrical system such that a redundancy of the electrical protection is provided to the plurality of distributed electrical components.

6. A system in accordance with claim 5, wherein the plurality of electrical dissipation paths are physically dispersed.

7. A system in accordance with claim 1, wherein said electrical conduit comprises a cable comprising:
    a first electrical connector configured to mate with a first electrical component of the plurality of electrical components;
    a second electrical connector configured to mate with a second electrical component of the plurality of electrical components;
    one or more electrical wires of said cable extending between said first electrical connector and said second electrical connector, said one or more electrical wires at least partially surrounded by a sheath along a length of said one or more electrical wires, said transient voltage suppressor device positioned within said sheath.

8. A system in accordance with claim 1, wherein said electrical conduit comprises a cable comprising a first cable end, a second cable end, and one or more electrical wires extending therebetween, said one or more electrical conduits at least partially surrounded by a sheath along a length of said one or more electrical wires, said TVS device positioned within said sheath.

9. A system in accordance with claim 1, wherein said electrical conduit comprises a wiring harness comprising at least one of a plurality of wires and a plurality of cables, each of said plurality of wires and plurality of cables comprising a first termination end and a second termination end, said plurality of wires and plurality of cables bound together along their respective lengths, said TVS device positioned along a length of one or more of said plurality of wires and plurality of cables.

10. A system in accordance with claim 1, wherein said electrical conduit comprises an electrical connector comprising:
    a grommet configured to receive at least one of a plug contact and a socket contact;
    a shell at least partially surrounding said grommet; and
    a TVS device positioned within the shell and electrically coupled to at least one of the plug contact and the socket contact.

11. A transient voltage suppressor (TVS) system comprising:
    a connecting component configured to electrically couple a first electrical component to a second electrical component located remotely from the first electrical component through one or more electrical conduits; and
    a plurality of distributed transient voltage suppressor devices positioned within the connecting component and electrically coupled to the one or more electrical conduits and to an electrical ground path, said plurality of transient voltage suppressor devices providing a plurality of electrical paths to electrical ground, each TVS device comprising a wide band-gap semiconductor material, wherein said TVS devices are distributed to locations proximate possible transient voltage source points.

12. A TVS system in accordance with claim 11, wherein said connecting component is configured to be positioned in a location having an ambient temperature of greater than 125° Celsius.

13. A TVS system in accordance with claim 11, wherein said connecting component comprises a cable comprising:
   a first electrical connector configured to mate with said first electrical component;
   a second electrical connector configured to mate with said second electrical component;
   one or more electrical conduits extending between said first electrical connector and said second electrical connector, said one or more electrical conduits at least partially surrounded by a sheath along a length of said one or more electrical conduits, said transient voltage suppressor system positioned within said sheath.

14. A TVS system in accordance with claim 11, wherein said connecting component comprises a cable comprising a first cable end, a second cable end, and one or more electrical conduits extending therebetween, said one or more electrical conduits at least partially surrounded by a sheath along a length of said one or more electrical conduits, said transient voltage suppressor system positioned within said sheath.

15. A TVS system in accordance with claim 11, wherein said connecting component comprises a wiring harness comprising at least one of a plurality of wires and a plurality of cables, each of said plurality of wires and plurality of cables comprising a first termination end, a second termination end, and one or more electrical conduits extending therebetween, said plurality of wires and plurality of cables bound together along their respective lengths, said transient voltage suppressor system positioned along a length of one or more of said plurality of wires and plurality of cables.

16. A TVS system in accordance with claim 11, wherein said connecting component comprises an electrical connector comprising:
   a grommet configured to receive at least one of a plug contact and a socket contact;
   a shell at least partially surrounding said grommet; and
   a TVS positioned within the shell and electrically coupled to at least one of the plug contact and the socket contact.

17. A TVS system in accordance with claim 16, wherein said electrical connector comprises at least one of a plug and a receptacle.

18. A method of protecting an electrical components from transient voltage, said method comprising:
   electrically coupling a plurality of electrical components to at least one of an electrical power distribution system and one or more communication lines of a signal distribution system through respective connecting components comprising a plurality of electrical conduits; and
   physically positioning a plurality of transient voltage suppression (TVS) devices within said connecting components and electrically coupling said plurality of transient voltage suppression devices to said at least one of an electrical power distribution system and one or more communication lines of a signal distribution system, wherein at least some of said plurality of TVS devices are physically spaced from others of said plurality of TVS devices such that said plurality of TVS devices form a plurality of electrical paths to ground with respect to said at least one of an electrical power distribution system and said communication lines.

19. A method in accordance with claim 18, wherein electrically coupling a plurality of transient voltage suppression (TVS) devices to said at least one of an electrical power distribution system and one or more communication lines of a signal distribution system comprises electrically coupling a plurality of TVS devices that are physically spaced apart from others of the plurality of electrical components.

20. A method in accordance with claim 18, further comprising positioning at least some of the plurality of electrical components in a location having an ambient temperature of greater than 125° Celsius.

21. A method in accordance with claim 18, further comprising positioning at least one of the plurality of TVS devices at least one of within and proximate to at least one of a flow of low temperature gas, a flow of high velocity gas, and in contact with an object having a relatively high thermal mass.

* * * * *